(12) United States Patent
Wu

(10) Patent No.: US 9,035,405 B2
(45) Date of Patent: May 19, 2015

(54) ACTIVE MATRIX IMAGE SENSING PANEL AND APPARATUS

(71) Applicants: INNOCOM TECHNOLOGY (SHENZHEN) CO., LTD., Shenzhen, Guangdong Province (CN); INNOLUX CORPORATION, Chu-Nan, Miao-Li County (TW)

(72) Inventor: Chih-Hao Wu, Chu-Nan (TW)

(73) Assignees: INNOCOM TECHNOLOGY (SHENZHEN) CO., LTD, Shenzhen, Guangdong Province (CN); INNOLUX CORPORATION, Chu-Nan, Miao-Li County (TW)

( * ) Notice: Subject to any disclaimer, the term of this patent is extended or adjusted under 35 U.S.C. 154(b) by 0 days.

(21) Appl. No.: 13/761,738

(22) Filed: Feb. 7, 2013

(65) Prior Publication Data

US 2013/0207169 A1 Aug. 15, 2013

(30) Foreign Application Priority Data

Feb. 13, 2012 (TW) .............................. 101104522 A

(51) Int. Cl.
*H01L 29/49* (2006.01)
*H01L 27/146* (2006.01)

(52) U.S. Cl.
CPC .... *H01L 27/14643* (2013.01); *H01L 27/14603* (2013.01); *H01L 27/14612* (2013.01); *H01L 27/14663* (2013.01)

(58) Field of Classification Search
USPC ................................................... 257/431, 443
See application file for complete search history.

(56) References Cited

U.S. PATENT DOCUMENTS

| | | | |
|---|---|---|---|
| 8,289,429 B2* | 10/2012 | den Boer et al. ............... | 348/302 |
| 2008/0035971 A1* | 2/2008 | Hong et al. .................... | 257/296 |
| 2008/0037323 A1* | 2/2008 | Shukuri et al. ............ | 365/185.04 |
| 2009/0179202 A1* | 7/2009 | Hong et al. ...................... | 257/59 |
| 2010/0020609 A1* | 1/2010 | Han et al. .................. | 365/185.09 |
| 2012/0069659 A1* | 3/2012 | Han et al. .................. | 365/185.09 |

* cited by examiner

*Primary Examiner* — Michael Shingleton
(74) *Attorney, Agent, or Firm* — Muncy, Geissler, Olds & Lowe, P.C.

(57) ABSTRACT

An active matrix image sensing panel includes a substrate and an image sensing pixel. The image sensing pixel is disposed on the substrate and includes a data line, a first thin film transistor (TFT) device and a second TFT device. The first TFT device includes a first electrode, a second electrode and a first gate electrode. The second electrode is coupled to the data line through a first via. The second TFT device includes a third electrode, a fourth electrode and a second gate electrode. The fourth electrode is electrically connected to the data line through a second via. The second electrode and the fourth electrode are connected with each other and overlap the data line.

14 Claims, 5 Drawing Sheets

ACTIVE MATRIX IMAGE SENSING PANEL AND APPARATUS

CROSS REFERENCE TO RELATED APPLICATIONS

This Non-provisional application claims priority under 35 U.S.C. §119(a) on Patent Application No(s). 101104522 filed in Taiwan, Republic of China on Feb. 13, 2012, the entire contents of which are hereby incorporated by reference.

BACKGROUND

1. Field

The invention relates to an image sensing panel and apparatus and, in particular, to an active matrix image sensing panel and apparatus.

2. Related Art

In the conventional X-ray imaging technology, images are produced by applying X-ray exposure to photographic film. In recent years, however, with the well development of semiconductor technology, X-ray imaging is improved to the so-called digital radiography (DR) technology that uses a flat and digital image sensing panel to produce images.

The principle of the digital radiography technology is briefly illustrated as below. When X-ray enters into an image sensing apparatus, a scintillator will convert X-ray into visible light that is then sensed by photosensors and thus converted into electric signals read out by data lines, and the images will be produced after processing the electric signals. As for the present DR technology, the photosensor is improved to silicon-based photodiode from charge coupled device (CCD), and also, X-ray is directly converted into electric signals without the scintillator.

FIG. 1 is a top-view diagram of a pixel layout of an image sensing panel applied to X-ray, showing one of the pixel structures. The pixel structure includes a data line 101, a scan line 102, a thin-film transistor (TFT) T, and a photosensor 104. The scan line 102 is electrically connected with the gate electrode 103 of the thin-film transistor T. The photosensor 104 is electrically connected with the drain 105 of the thin-film transistor T through a via V11. The data line 101 is electrically connected with the source 106 of the thin-film transistor T through a via V12. The photosensor 104 is also electrically connected with a bias line 107 through a via V13.

Entering into the photosensor 104, the light excites electron-hole pairs in the semiconductor layer of the photosensor 104. Meanwhile, a bias voltage is applied to the photosensor 104 through the bias line 107 so that the electron-hole pairs can be separated into electrons and holes as signals. The signals are transmitted to the drain of the TFT T through the via V11. Meanwhile, the scan line 102 enables the gate electrode 103 so that the signals can be read out by the data line 101 through the via V12. After the signals of all pixels are respectively read out, they can be processed by the processing module to produce the images.

However, during the manufacturing process of the image sensing panel, ambient particles often fall down to the pixel structure, causing the data line break. Besides, because the pixel structure is manufactured layer by layer, the broken portion of the data line is incapable of being repaired. Accordingly, the product yield is reduced.

Therefore, it is an important subject to provide an active matrix image sensing panel and apparatus that can eliminate the problem caused by the broken data line to improve the product yield.

SUMMARY

In view of the foregoing subject, an objective of the invention is to provide an active matrix image sensing panel and apparatus that can eliminate the problem caused by the broken data line to improve the product yield.

To achieve the above objective, an active matrix image sensing panel of the invention comprises a substrate and an image sensing pixel. The image sensing pixel is disposed on the substrate and comprises a data line, a first thin-film transistor (TFT) device, and a second thin-film transistor (TFT) device. The first TFT device is disposed on the substrate and has a first electrode, a second electrode and a first gate electrode, wherein the second electrode is electrically connected with the data line through a first via. The second TFT device is disposed on the substrate and has a third electrode, a fourth electrode and a second gate electrode, wherein the fourth electrode is electrically connected with the data line through a second via. The second electrode and the fourth electrode are connected with each other and overlap the data line.

In one embodiment, the image sensing pixel further comprises a first photo-sensing device and a scintillator layer disposed on a side of the first photo-sensing device. The scintillator layer converts X-ray into visible light for example.

In one embodiment, the image sensing pixel includes two sub-pixels configured with a layout of mirror symmetry.

In one embodiment, the image sensing pixel further includes a first scan line and a second scan line. The second electrode doesn't overlap the data line at the intersection of the data line and the first scan line, besides, the fourth electrode doesn't overlap the data line at the intersection of the data line and the second scan line, whereby the parasitic capacitance can be reduced.

In one embodiment, the first photo-sensing device includes at least one P-N junction.

In one embodiment, the first electrode is electrically connected with a bottom electrode of the first photo-sensing device.

To achieve the above objective, an active matrix image sensing apparatus comprises the above-mentioned active matrix image sensing panel and a processing module electrically connected with the data line of the active matrix image sensing panel.

In summary, in one of the image sensing pixels of the active matrix image sensing panel of the invention, the second electrode of the first TFT device is electrically connected with the data line through the first via, the fourth electrode of the second TFT device is electrically connected with the data line through the second via, and the second electrode and the fourth electrode are connected with each other and overlap the data line. Accordingly, when one point at somewhere of the data line is broken, the signal of the data line still can be transmitted to the unbroken portion of the data line through the second electrode and the fourth electrode, and then read out from the data line. Therefore, in the invention, the signals can be read out with the completeness when the data line has a broken portion, so as to improve the product yield.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION

The present invention will be apparent from the following detailed description, which proceeds with reference to the accompanying drawings, wherein the same references relate to the same elements.

Figure 1:
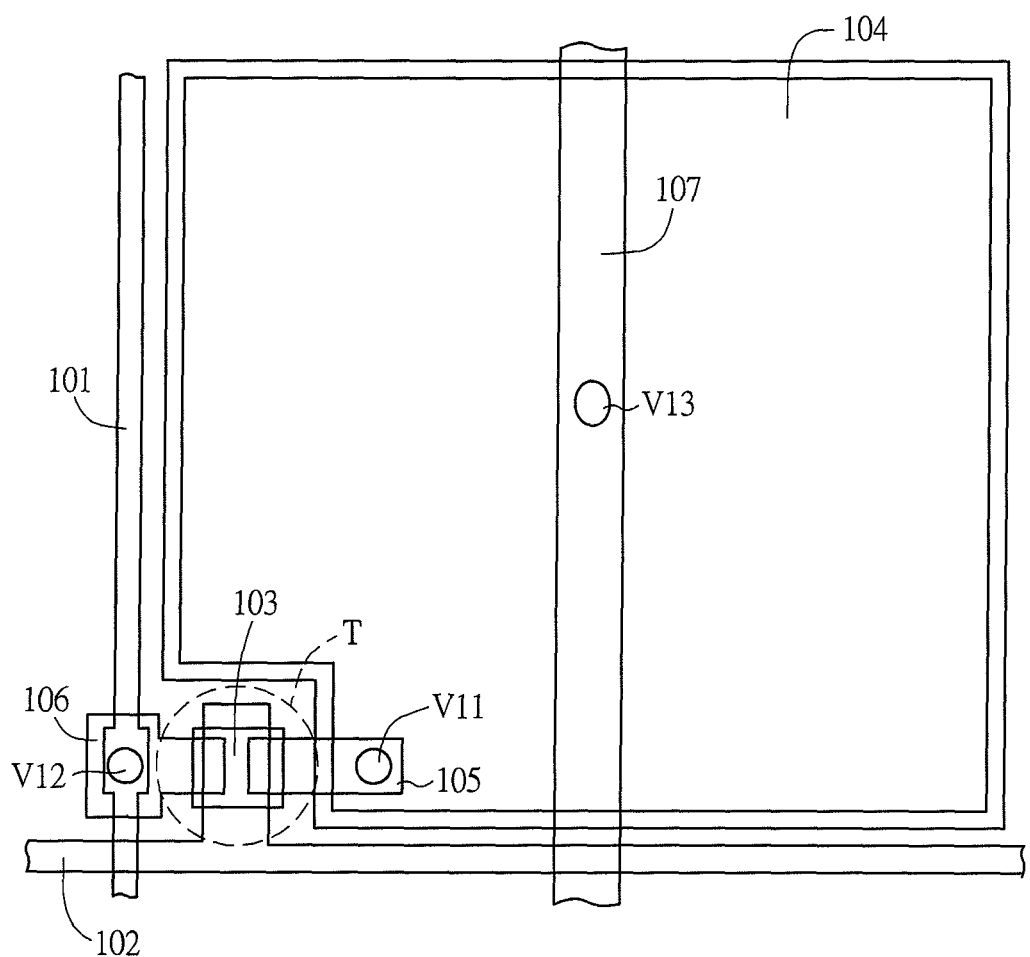
FIG. 1 is a top-view diagram of a pixel layout of a conventional image sensing panel applied to X-ray.
Figure 2:
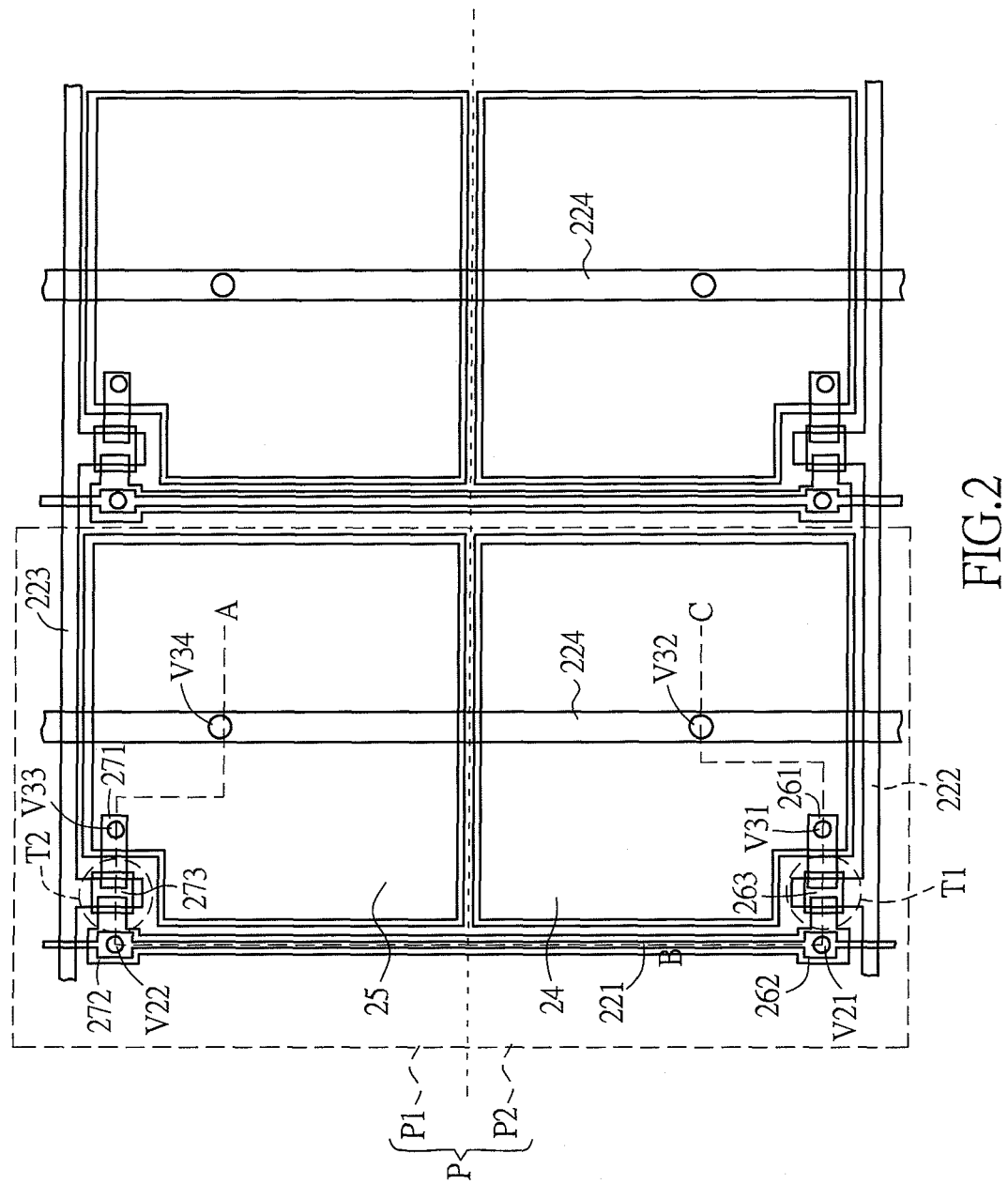
FIG. 2 is a schematic diagram of a pixel layout of some image sensing pixels of an active matrix image sensing panel of a preferred embodiment of the invention.

An active matrix image sensing panel of a preferred embodiment of the invention includes a plurality of image sensing pixels. FIG. 2 is a top-view diagram of the layout of several image sensing pixels, FIG. 3 is a cross-sectional diagram taken along the line B-C in FIG. 2, and FIG. 4 is a cross-sectional diagram taken along the line A-C in FIG. 2.

Figure 3:
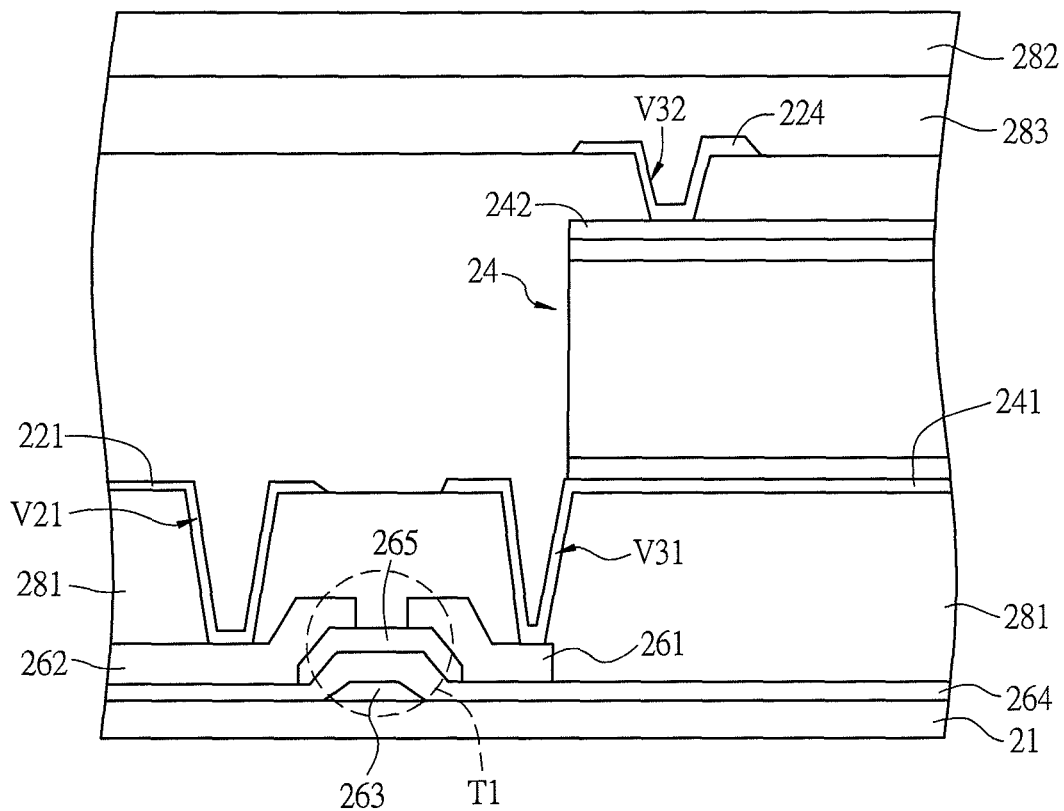
FIG. 3 is a cross-sectional diagram taken along the line B-C in FIG. 2.
Figure 4:
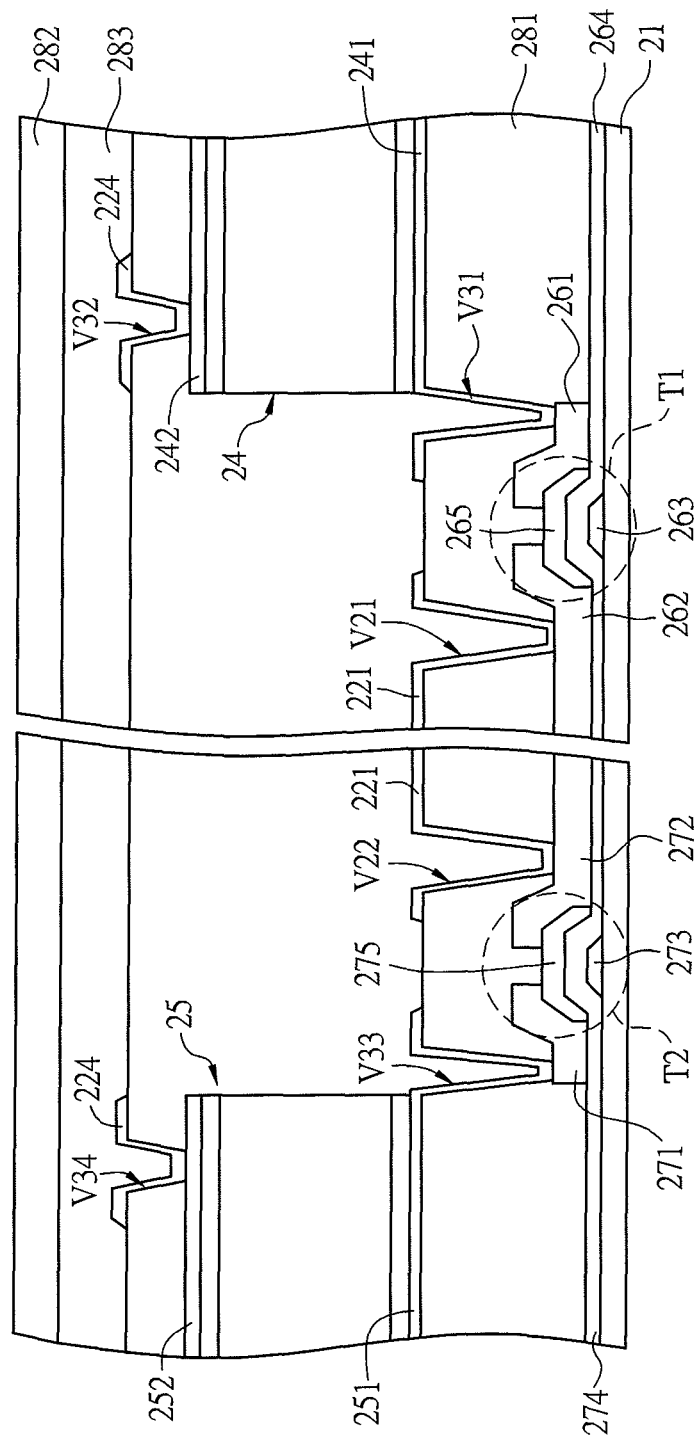
FIG. 4 is a cross-sectional diagram taken along the line A-C in FIG. 2.

As shown in FIGS. 2 to 4, at least one of the image sensing pixels P of the active matrix image sensing panel includes a substrate 21, a data line 221, a first scan line 222, a second scan line 223, a first photo-sensing device 24, a second photo-sensing device 25, a first thin-film transistor (TFT) device T1, and a second thin-film transistor device T2. The data line 221, the first scan line 222, the second scan line 223, the first photo-sensing device 24, the second photo-sensing device 25, the first TFT device T1 and the second TFT device T2 are disposed on the substrate 21. In the embodiment, the image sensing pixel P is instanced as including two sub-pixels P1 and P2.

The first TFT device T1 has a first electrode 261, a second electrode 262 and a first gate electrode 263. For example, the first electrode 261 is drain, and the second electrode 262 is source. The first TFT device T1 further includes a gate-insulating layer 264 and an active layer 265, and the gate-insulating layer 264 covers the first gate electrode 263 so that the first gate electrode 263 is insulated from the active layer 265 and the first and second electrodes 261 and 262. Herein, the gate-insulating layer 264 is made of silicon nitride (SiNx), and the active layer 265 is made of amorphous silicon, for example.

The first gate electrode 263 is electrically connected with the first scan line 222, and the first electrode 261 is electrically connected with the first photo-sensing device 24. In the embodiment, the first electrode 261 is electrically connected with the first photo-sensing device 24 through a via V31. In detail, a bottom electrode 241 of the first photo-sensing device 24 is extended to the via V31 to electrically connect the first electrode 261.

A top electrode 242 of the first photo-sensing device 24 is electrically connected with a bias line 224 through a via V32. The top electrode 242 can be a transparent electrode, which can be made of indium tin oxide (ITO) for example. The first photo-sensing device 24 includes at least one P-N junction. The second electrode 262 is electrically connected with the data line 221 through a first via V21. Besides, an insulating layer 281 is disposed between the second electrode 262 and the data line 221. The material of the insulating layer 281 includes silicon nitride (SiNx) or Polyfluoroalkoxy (PFA) for example.

The second TFT T2 includes a third electrode 271, a fourth electrode 272, and a second gate electrode 273. Herein, the third electrode 271 is drain, and the fourth electrode 272 is source, for example. The second TFT T2 further includes a gate-insulating layer 274 and an active layer 275. The gate-insulating layer 274 covers the second gate electrode 273 so that the second gate electrode 273 is insulated from the active layer 275 and the third and fourth electrodes 271 and 272. Herein, the gate-insulating layer 274 is made of silicon nitride (SiNx), and the active layer 275 is made of amorphous silicon, for example.

The second gate electrode 273 is electrically connected with the second scan line 223, and the third electrode 271 is electrically connected with the second photo-sensing device 25. In the embodiment, the third electrode 271 is electrically connected with the second photo-sensing device 25 through a via V33. In detail, a bottom electrode 251 of the second photo-sensing device 25 is extended to the via V33 to electrically connect the third electrode 271.

A top electrode 252 of the second photo-sensing device 25 is electrically connected with a bias line 224 through a via V34. The top electrode 252 can be a transparent electrode, which can be made of indium tin oxide (ITO) for example. The second photo-sensing device 25 includes at least one P-N junction. The fourth electrode 272 is electrically connected with the data line 221 through a second via V22. Besides, the insulating layer 281 is disposed between the fourth electrode 272 and the data line 221.

In the embodiment, the second electrode 262 and the fourth electrode 272 are connected with each other, and overlapped with the above data line 221. In other words, the second electrode 262 is extended toward the direction of the fourth electrode 272 to connect the fourth electrode 272, or the fourth electrode 272 is extended toward the direction of the second electrode 262 to connect the second electrode 262, or the above cases both occur. Therefore, when some point of the data line 221 is broken, the signal can be still transmitted to the unbroken portion of the data line 221 through the second electrode 262 and the fourth electrode 272, and then read out from the data line 221.

In the embodiment, the image sensing pixel P further includes a scintillator layer 282, which is disposed at the same side of the first and second photo-sensing devices 24 and 25 and upon another insulating layer 283. The scintillator layer 282 can convert X-ray into visible light, thereby helping the sensing of the photo-sensing devices 24 and 25.

As shown in FIG. 2, the image sensing pixel P includes two sub-pixels P1 and P2, which are configured with a layout of mirror symmetry. In this case, the first TFT T1 and the second TFT T2 are configured with mirror symmetry on the center line of the image sensing pixel P. Besides, the second electrode 262 doesn't overlap the data line 221 at the intersection of the data line 221 and the first scan line 222, and the fourth electrode 272 doesn't overlap the data line 221 at the intersection of the data lie 221 and the second scan line 223, thereby preventing the parasitic capacitance formed by the second electrode 262 and the first scan line 222 and also preventing the parasitic capacitance formed by the fourth electrode 272 and the second scan line 223. Within the range of the single image sensing pixel P, the ratio of the length of the portion of the data line 221 not overlapped with the second electrode 262 and the fourth electrode 272 to the length of the data line 221 is smaller than ½, and preferably smaller than ⅙. Because the sub-pixels are configured with mirror symmetry, the above ratio can be minimized.

The following is the illustration of the operation of the active matrix image sensing panel and the image sensing pixel P thereof. When the light enters into the photo-sensing device 24, it will excite the semiconductor layer of the photo-sensing device 24 to generate electron-hole pairs. Meanwhile, a bias voltage is applied to the photo-sensing device 24 through the bias line 224 so that the electron-hole pairs are separated into electrons and holes as signals. The signals are transmitted to the first electrode 261 of the TFT T1 through the via V31. Besides, the scan line 222 enables the gate electrode 263 so that the signals can be read out by the data line 221 through the via V21. If the data line 221 is broken between the sub-pixels P1 and P2, the photo-sensing signals can be transmitted to the unbroken portion of the data line 221 through the second electrode 262 and the fourth electrode 272. In detail, the signals can be transmitted to the data line 221 through the second via V22 for example.

To be noted, FIG. 2 only shows two image sensing pixels P, but nevertheless, for the active matrix image sensing panel, it can have many image sensing pixels P disposed in array and many data lines 221 and scan lines 222 and 223 intersected with each other.

Figure 5:
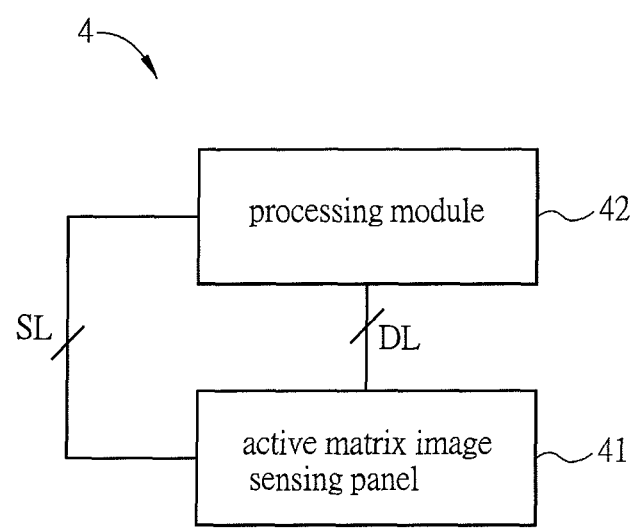
FIG. 5 is a block diagram of an active matrix image sensing apparatus of a preferred embodiment of the invention.

FIG. 5 is a block diagram of an active matrix image sensing apparatus 4 of a preferred embodiment of the invention. The active matrix image sensing apparatus 4 includes an active matrix image sensing panel 41 and a processing module 42. The active matrix image sensing panel 41 can be the active matrix image sensing panel as mentioned in the above embodiments. The processing module 42 is electrically connected with the data lines DL of the active matrix image sensing panel 41, and receives a plurality of photo-sensing signals of a plurality of first photo-sensing devices 24 and a plurality of second photo-sensing devices 25 to produce an image data. The data lines DL include the data lines 221 as mentioned above. The processing module 42 is further electrically connected with the scan lines SL of the active matrix image sensing panel 41 to sequentially enable the scan lines SL to read out the photo-sensing signals. The scan lines SL include the first scan lines 222 and the second scan lines 223 as mentioned above. The image data can be displayed after the subsequent image processing and displaying.

In summary, in one of the image sensing pixels of the active matrix image sensing panel of the invention, the second electrode of the first TFT device is electrically connected with the data line through the first via, the fourth electrode of the second TFT device is electrically connected with the data line through the second via, and the second electrode and the fourth electrode are connected with each other and overlap the data line. Accordingly, when one point at somewhere of the data line is broken, the signals still can be transmitted to the unbroken portion of the data line through the second electrode and the fourth electrode, and then read out from the data line. Therefore, in the invention, the signals can be read out with the completeness when the data line has a broken portion, so as to improve the product yield.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An active matrix image sensing panel, comprising:
    a substrate; and
    an image sensing pixel disposed on the substrate and comprising:
    a data line;
    a first thin-film transistor (TFT) device disposed on the substrate and having a first electrode, a second electrode, and a first gate electrode, wherein the second electrode is electrically connected with the data line through a first via; and
    a second thin-film transistor (TFT) device disposed on the substrate and having a third electrode, a fourth electrode, and a second gate electrode, wherein the fourth electrode is electrically connected with the data line through a second via, and a portion of the second electrode is extended toward a direction of the fourth electrode to connect the fourth electrode and the portion of the second electrode is overlapping the data line, and an insulating layer is disposed between the portion of the second electrode and the data line.

2. The active matrix image sensing panel as recited in claim 1, wherein the image sensing pixel further comprises a first photo-sensing device and a scintillator layer disposed on a side of the first photo-sensing device.

3. The active matrix image sensing panel as recited in claim 2, wherein the scintillator layer converts X-ray into visible light.

4. The active matrix image sensing panel as recited in claim 1, wherein the image sensing pixel includes two sub-pixels configured with a layout of mirror symmetry.

5. The active matrix image sensing panel as recited in claim 1, wherein the image sensing pixel further includes a first scan line and a second scan line, the second electrode doesn't overlap the data line at the intersection of the data line and the first scan line, or the fourth electrode doesn't overlap the data line at the intersection of the data line and the second scan line.

6. The active matrix image sensing panel as recited in claim 1, wherein the first photo-sensing device includes at least one P-N junction.

7. The active matrix image sensing panel as recited in claim 1, wherein the first electrode is electrically connected with a bottom electrode of the first photo-sensing device.

8. An active matrix image sensing apparatus, comprising:
    an active matrix image sensing panel comprising:
    a substrate; and
    an image sensing pixel disposed on the substrate and comprising:
    a data line;
    a first thin-film transistor (TFT) device disposed on the substrate and having a first electrode, a second electrode and a first gate electrode, wherein the second electrode is electrically connected with the data line through a first via; and
    a second thin-film transistor (TFT) device disposed on the substrate and having a third electrode, a fourth electrode and a second gate electrode, wherein the fourth electrode is electrically connected with the data line through a second via, and a portion of the second electrode is extended toward a direction of the fourth electrode to connect the fourth electrode and the portion of the second electrode is overlapping the data line, and an insulating layer is disposed between the portion of the second electrode and the data line; and
    a processing module electrically connected with the data line of the active matrix image sensing panel.

9. The active matrix image sensing apparatus as recited in claim 8, wherein the image sensing pixel further comprises a first photo-sensing device and a scintillator layer disposed on a side of the first photo-sensing device.

10. The active matrix image sensing apparatus as recited in claim 9, wherein the scintillator layer converts X-ray into visible light.

11. The active matrix image sensing apparatus as recited in claim 8, wherein the image sensing pixel includes two sub-pixels configured with a layout of mirror symmetry.

12. The active matrix image sensing apparatus as recited in claim 8, wherein the image sensing pixel further includes a first scan line and a second scan line, the second electrode doesn't overlap the data line at the intersection of the data line and the first scan line, or the fourth electrode doesn't overlap the data line at the intersection of the data line and the second scan line.

13. The active matrix image sensing apparatus as recited in claim 8, wherein the first photo-sensing device includes at least one P-N junction.

14. The active matrix image sensing apparatus as recited in claim 8, wherein the first electrode is electrically connected with a bottom electrode of the first photo-sensing device.

* * * * *